(12) United States Patent
Leong et al.

(10) Patent No.: US 7,977,692 B2
(45) Date of Patent: Jul. 12, 2011

(54) SMT LED WITH HIGH LIGHT OUTPUT FOR HIGH POWER APPLICATIONS

(75) Inventors: Ak Wing Leong, Penang (MY); Kheng Leng Tan, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 863 days.

(21) Appl. No.: 11/394,625

(22) Filed: Mar. 31, 2006

(65) Prior Publication Data

US 2007/0228402 A1   Oct. 4, 2007

(51) Int. Cl.
*H01L 33/00* (2010.01)

(52) U.S. Cl. ............. 257/98; 257/79; 257/99; 257/100; 257/E33.056; 257/E33.062

(58) Field of Classification Search .................... 257/79, 257/98–100, E33.056, E33.62
See application file for complete search history.

(56) References Cited

U.S. PATENT DOCUMENTS

| 6,858,880 B2 * | 2/2005 | Horiuchi et al. | 257/100 |
| 2003/0201451 A1 * | 10/2003 | Suehiro et al. | 257/98 |
| 2007/0034886 A1 * | 2/2007 | Wong et al. | 257/98 |

* cited by examiner

*Primary Examiner* — Cuong Q Nguyen
*Assistant Examiner* — Trang Q Tran

(57) ABSTRACT

A method and apparatus is described for a light-emitting diode with high light output. A polymeric cup to reflect light holds a light-emitting diode chip connected to surface-mounting leads and is filled with an optically clear filter. The use of a polymeric cup allows for better bonding between the cup and the filler.

9 Claims, 3 Drawing Sheets

SMT LED WITH HIGH LIGHT OUTPUT FOR HIGH POWER APPLICATIONS

CROSS-REFERENCE TO RELATED APPLICATIONS

Not applicable.

TECHNICAL FIELD

The present invention is directed to light-emitting diode assemblies, and more specifically to surface-mounted light-emitting diode structures suitable for use in high power application.

BACKGROUND OF THE INVENTION

Conventional light emitting diodes often comprise a light emitting diode chip or die mounted with a metal cup having a highly polished surface. The cup is then filled with an epoxy filler. The finished structures can then be used as a surface-mounted (SMT) light emitting diode (LED).

One drawback of these conventional designs of LEDs is that there is often poor adhesion between the epoxy filler and the metal cup. This, in turn can result in a gap forming between the filler and the cup as the filler expands and contracts during the life cycle of the LED. The expansion and contraction can cause the wire band between the LED chip and the SMT leads to rupture or break. In severe cases, the LED chip itself may rupture.

A need exists, therefore, for a LED which has the reflectivity of a metal cup, but which provides for sufficient bonding between the cup and the filler such that two remain bonded together during the normal life cycle of the LED.

BRIEF SUMMARY OF THE INVENTION

Embodiments of the present invention mount a light-emitting diode chip inside a cup manufactured from polymeric material, that has a highly polished surface for reflecting light. Light-transmitting filler, such as an epoxy resin capable of bonding with the polymeric cup, fills the cup. Alternative embodiments of the present invention position polymeric cup with reflective surface in a cavity described by the leads of a surface-mounting structure. A light-emitting diode is electrically connected to the leads and placed in the base of the cup, and held in position with a transparent encapsulant capable of bonding with the cup.

Embodiments of the present invention also include methods of assembling light-emitting apparatus. Methods in accordance with the present invention provide a polymeric cup with reflective surface and position a light-emitting diode near its bottom. The diode is connected to surface mounting leads and then the cup is filled with a transparent encapsulant that is capable of binding with the surface of the cup.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
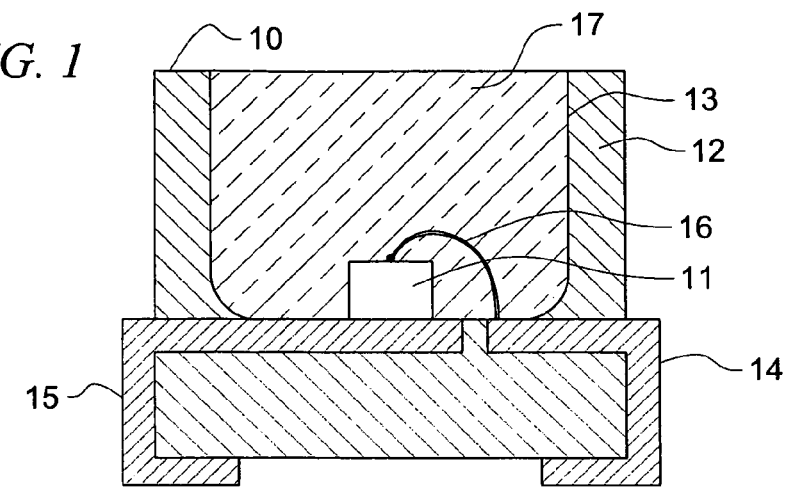
FIG. 1 is a is a cross-sectional view of one embodiment of the present invention.

FIG. 1 depicts an SMT LED arranged in accordance to one embodiment of the present invention. Light-emitting diode 10 is formed using light-emitting diode chip 11 mounted inside housing 12. Housing 12 is comprised of cup part 13 having concave structure and a surface adapted to reflect light. Cup part 13 may be given a reflective surface by any of the means known in the art such as polishing the surface. Housing 12 may be fabricated from any shapeable material such as plastic, ceramic and metal.

SMT leads 14 and 15 are mounted to the base of housing 12 and extend into 13. Leads 14 and 15 are sealed to housing 12 so as to prevent migration of moisture into the light-emitting diode. In the example embodiment of FIG. 1, housing 12 is formed from plastic, and spun-on glass is used as a sealant for all metal to plastic interfaces. Light-emitting diode chip 11 may be connected directly to SMT leads 14 and 15 or, as depicted in FIG. 1, be connected using wire bond 16.

Cup part 13 is filled with light transmitting filler 17. Filler 17 is chosen for its optical clarity when cured and its ability to bond with the polymer used to form cup 13. Embodiments of the present invention may use white epoxy resins, or any other sufficiently transparent resins including, but not limited to polyacrylics, polycarbonates and polysiloxaues.

Figure 2:
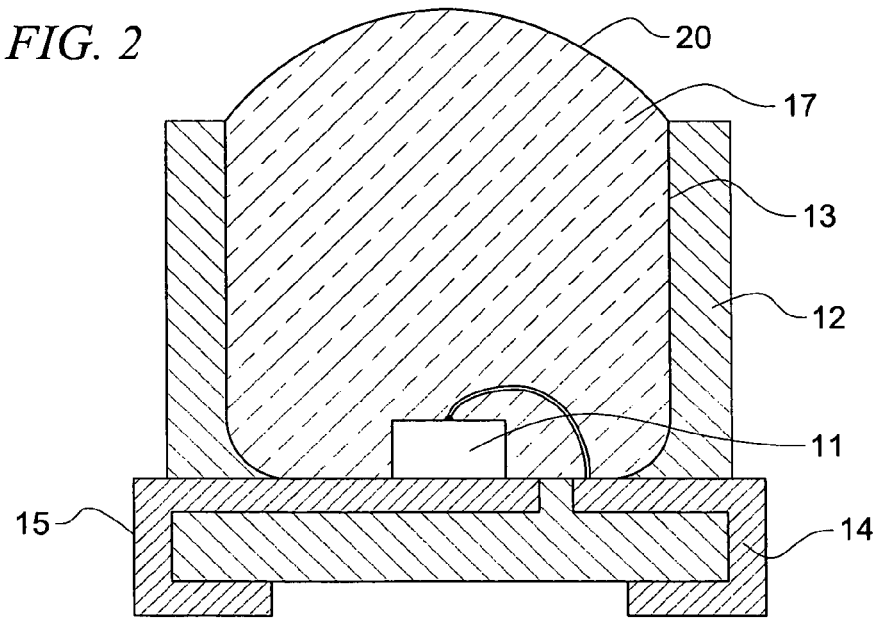
FIG. 2 is a cross-sectional view of an alternative embodiment of the present invention.

In the embodiment shown in FIG. 1, filler 17 is flush with the upper edges of housing 12. In an alternative embodiment filler 7 can be used to form a light-directing structure. FIG. 2 depicts an embodiment of the present invention in which filler 17 is used to form light-directing structure 20. Although FIG. 2 depicts a dome-shaped structure, any shape or structure which directs light may be formed. For example, a frustoconical or frustopyramidal shape may be used. In addition, the light-directing structure may be formed separately and then bonded to the light emitting diode.

Figure 4A:
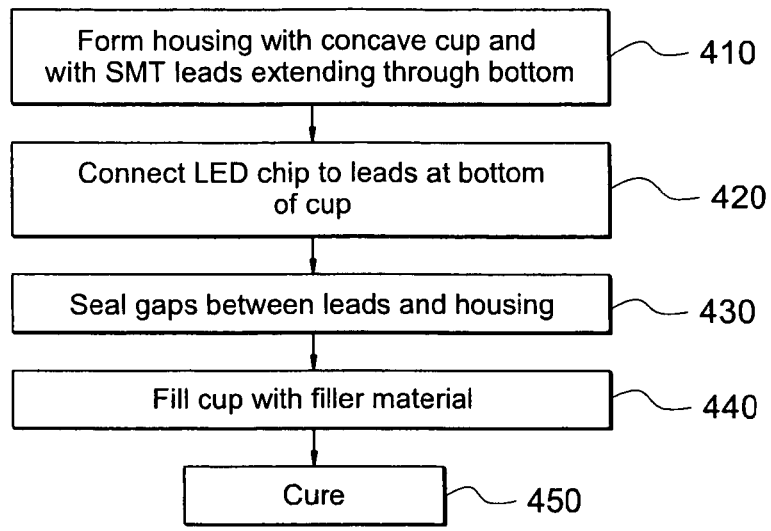
FIGS. 4A-4C are flow diagrams illustrating the steps of one embodiment of the present invention.

FIG. 4A is a flow diagram outlining steps of one embodiment of the present invention. In step 410, a housing with a concave cup structure (such as cup 13 of FIGS. 1 and 2) is formed allowing SMT leads to extend through the walls of the housing and into the bottom of the cup part. In step 420, a light-emitting die or chip (such as chip 11 of FIGS. 1,2) is electronically connected to the SMT leads either directly or by means of wire bonds. In step 430, a sealant, such as a spin-on glass sealant, is used to seal any gaps which may exist between the SMT leads and the housing. Once the sealant is in place and has been allowed to cure, a filler or other encapsulant is introduced into the cup, in step 440. The filler is chosen for its optical clarity and its ability to bond with the polymer used to make the cup. In many embodiments, epoxy resin is used as the filler, however, other optically clear materials such as those described above can be used. In step 450, the filler is cured.

Figure 4B:
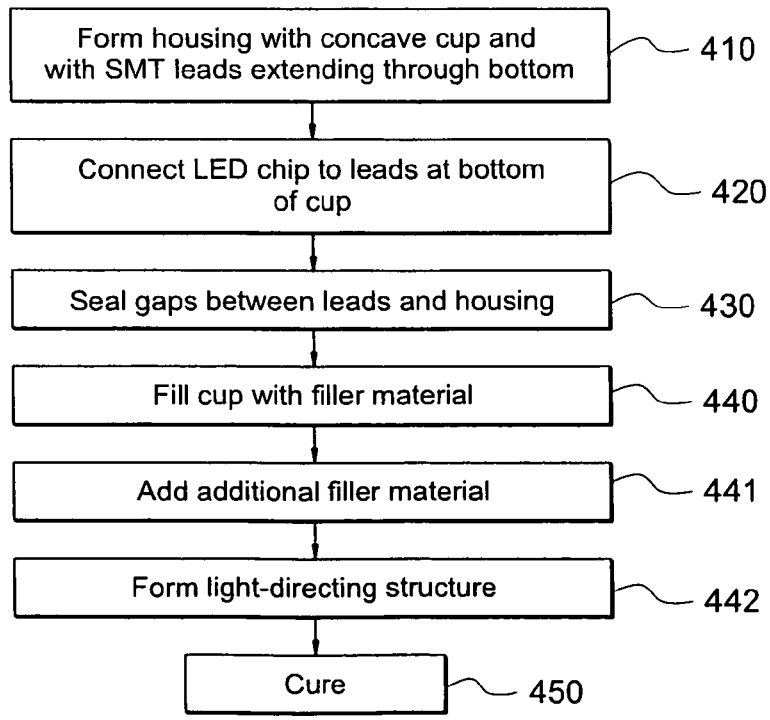

Alternative embodiments incorporate steps to form light-directing structures. In the example embodiment of FIG. 4B, the process is substantially the same as that of 4A until step 441. In step 441, additional filler (whether resin or other appropriate material) is added, and, in step 442, the desired light-directing shape (such as dome 20 or FIG. 2) is shaped. Once formed, the filler is cured in step 450.

Figure 4C:
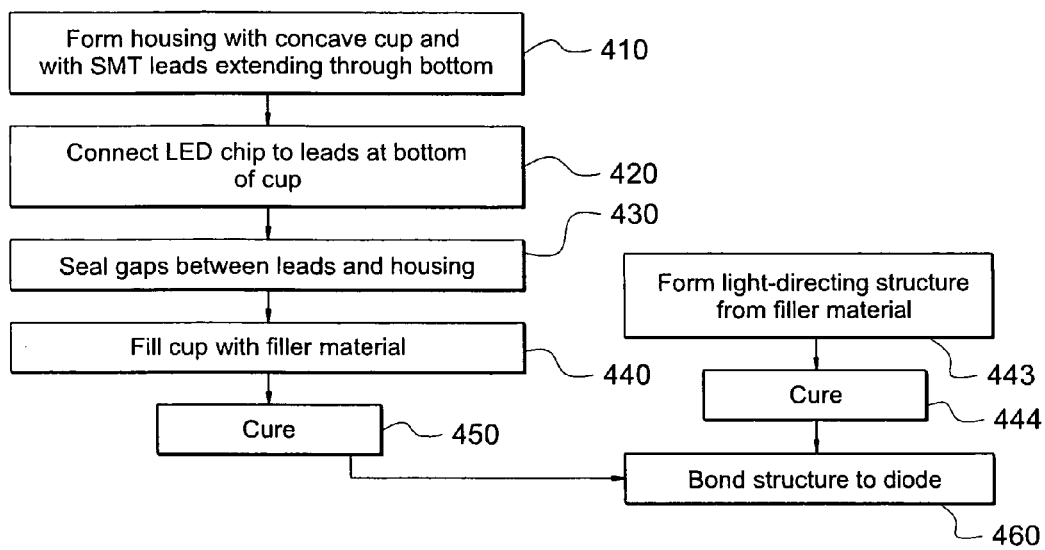

In the example embodiment of FIG. 4C, the light-directing structure is formed separately. A light-emitting diode is formed using steps 410-450 in a manner similar to FIG. 4A. In a separate process, a light-directing structure is formed (using the same material used as filler in step 440) and cured in step 444. The structure is then bonded to the diode in step 460.

Figure 3:
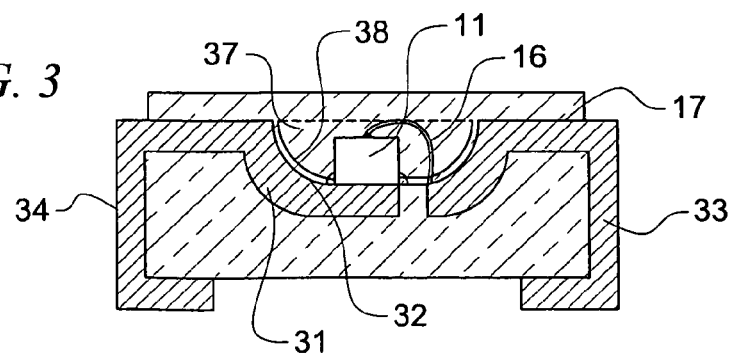
FIG. 3 is a cross-sectional view of an alternate embodiment of the invention.

FIG. 3 shows an alternate embodiment of the present invention. In this embodiment, SMT leads 33 and 34 are used to form cavity 31. Plastic cup 37 is then placed in cavity 31 formed by leads 33 and 34. Cup 37 has surface 38, which has been polished to reflect the light produced by light-emitting diode chip 11 attached to SMT leads 33 and 34 either directly or through wire bond 16. Light-emitting diode chip 11 and SMT leads 33 and 34 are encapsulated with a filler or encapsulant 17, eliminating the need for a separate housing body. The filler or encapsulant may be the same as the filler materials described above. As with the embodiment shown in FIG. 2, the filler or encapsulant can be shaped to form a light-directing structure such as those described above.

Figure 5:
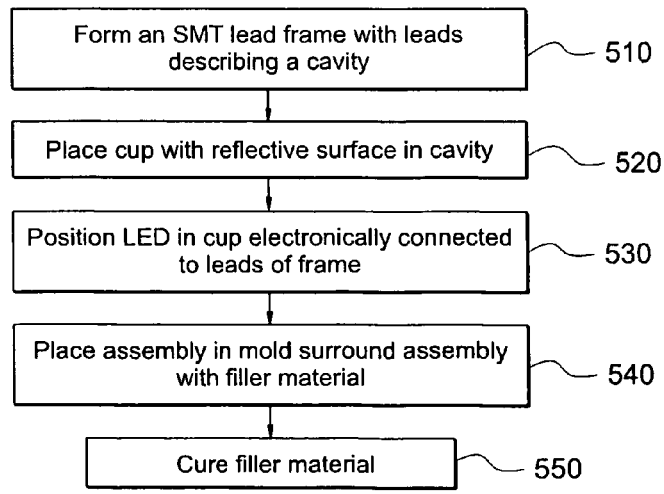
FIG. 5 is a flow diagram illustrating the steps of an alternative embodiment of the present invention.

FIG. 5 illustrates an example method of forming the embodiment shown in FIG. 3. In step 510, a SMT lead frame is formed with its leads describing a cavity. In step 520, a plastic cup having an inner surface adapted to reflect light is placed in the cavity formed by the leads. In step 530, a light-emitting diode chip is positioned at the bottom of the cup structure, and electronically connected by directly attaching the chip and/or by using a wire band. In step 540, the entire assembly is then placed in a mold into which a filler or encapsulant is introduced surrounding the cup structure containing the light-emitting diode chip. In step 550, the filler is then cured and the resulting light-emitting diode can be released from this mold. The ends of the SMT leads can then be formed into their desired shape.

Embodiment of the present invention may enjoy significant advantages over conventional structures. For example, the LEDs produced by current invention are typically moisture resistant, meeting the requirements for Moisture Sensitivity Level 1 as defined by JEDEC Standard J-STD-20. In addition, in many embodiments, the bond between the cup and the filler may remain in tact after repeated cycles of expansion and contraction of the filler material.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a polymeric base having a concave structure, wherein a surface of said concave structure reflects light;
   a light-emitting diode chip located near the bottom of said concave structure and electrically connected to a pair of surface-mount leads;
   a filler material filling said concave structure that bonds with said surface of said structure;
   wherein said surface is formed from a polymeric material;
   wherein said filler material is an optically-clear resin; and
   wherein said filler material is white epoxy resin.

2. The device of claim 1 that meets the requirement of SML1.

3. The device of claim 1 wherein said connection between said diode and said leads is formed in part from spun glass.

4. A device comprising:
   a base comprising a polymeric material;
   a concave structure formed in said base, said concave structure comprising a concave light-reflective surface formed in said polymeric material;
   a light-emitting diode located at least partially within said concave structure and electrically connected to a pair of surface-mount leads;
   a filler material within said concave structure that is bonded with said light-reflective surface; and
   wherein said light-reflective surface is formed from a polymeric material.

5. The device of claim 4 wherein said filler material forms a light-directing structure.

6. The device of claim 5 wherein said light-directing structure is dome-shaped.

7. The device of claim 5 wherein said light-directing structure is frustoconical.

8. The device of claim 4 wherein said filler material comprises an epoxy resin.

9. The device of claim 4 wherein said concave structure is positioned in a cavity formed by said surface-mount leads.

* * * * *